United States Patent [19]

Huang et al.

[11] Patent Number: 4,907,534
[45] Date of Patent: Mar. 13, 1990

[54] GAS DISTRIBUTOR FOR OMVPE GROWTH

[75] Inventors: Rong-Ting Huang, Highland Park; Dumrong Kasemset, Hopewell, both of N.J.

[73] Assignee: Siemens Aktiengesellschaft, Berlin and Munich, Fed. Rep. of Germany

[21] Appl. No.: 282,082

[22] Filed: Dec. 9, 1988

[51] Int. Cl.$^4$ .............................................. C23C 16/00
[52] U.S. Cl. .................................... 118/725; 118/715; 156/611
[58] Field of Search ................. 118/715, 725; 156/611

[56] References Cited

FOREIGN PATENT DOCUMENTS 181122 8/1986 Japan .................................. 118/715

OTHER PUBLICATIONS

Ludowise, J. appl. Phys. 58(8), Oct. 15, 1985, pp. R31–R55.
Solid-State Tech., May '88, by M. L. Hammond, pp. 159–164.
"Radial Manifold Enables MOCVD to Compete with MBE", Jan. 11, 1986, by J. G. Posa, Crystal Specialities, Inc., 30 pages.

Primary Examiner—Richard Bueker
Attorney, Agent, or Firm—John Francis Moran

[57] ABSTRACT

A new gas distributor 31 provides an extremely uniform gas across a wide cross section distance. An OMVPE reactor equipped with this distributor, a unique low volume quartz insert, a load-locked growth chamber and a low pressure operation scheme provide a reactor system capable of growing extremely uniform GaAs and AlGaAs epilayers across four two-inch wafers or one three to four inch wafer with atomic layer abruptness capablity. The performance of such an OMVPE reactor provides superior morphology and throughout compared to conventional OMVPE reactors with equivalent performance to MBE. Since the gas distributor is capable of distributing an extremely uniform gas across a wide cross-section distance, it can also be employed in other types of OMVPE reactors to improve the material uniformity.

7 Claims, 4 Drawing Sheets

GAS INJECTION SCHEMATIC

CROSS-SECTION VIEW OF THE GAS DISTRIBUTION

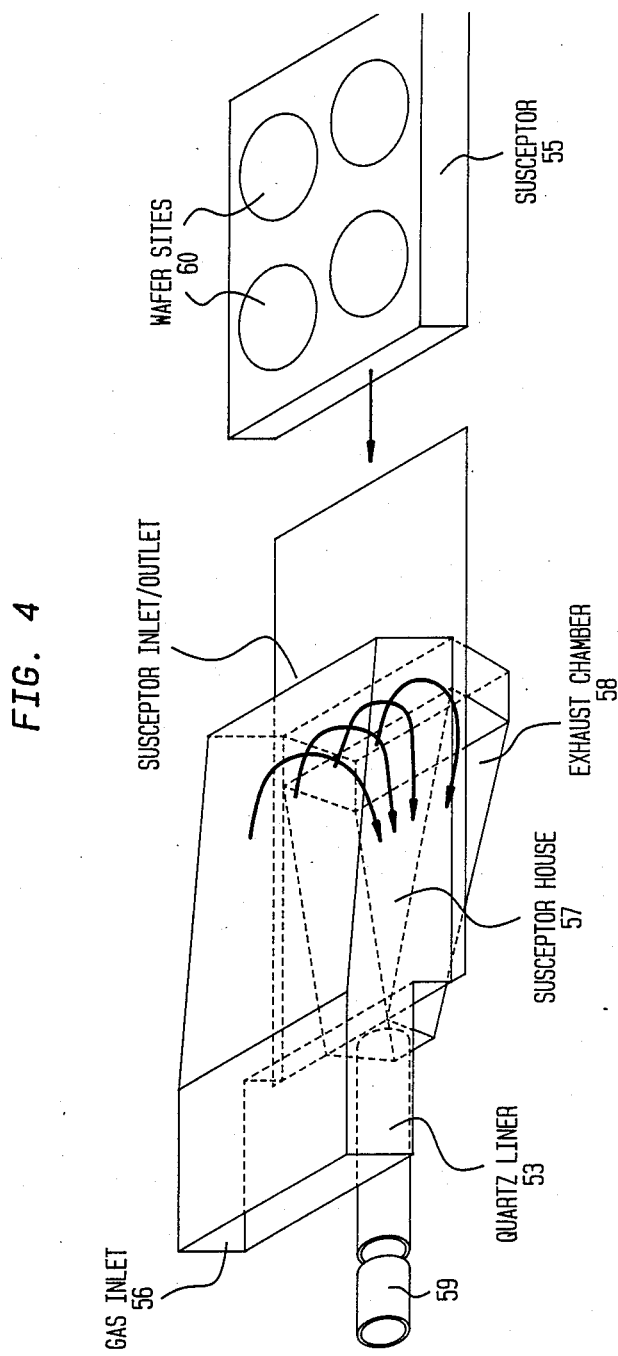

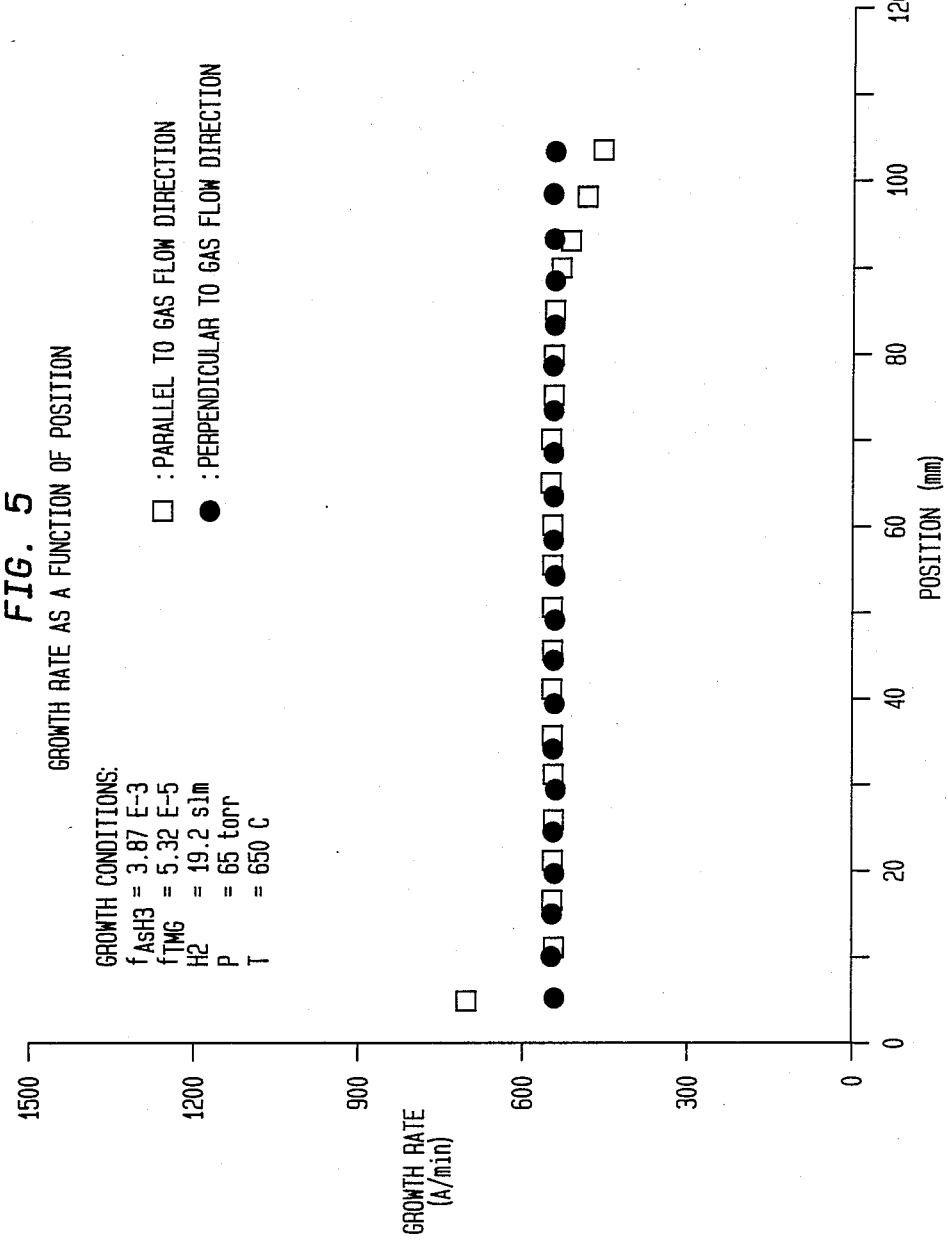

GAS DISTRIBUTOR FOR OMVPE GROWTH

BACKGROUND OF THE INVENTION

This invention relates to vapor phase deposition techniques, and it relates, more particularly, to a gas distribution arrangement for organometallic vapor phase epitaxy (OMVPE) for distributing highly uniform gas flow across a wide cross-section dimension to improve epilayer uniformity throughout a large growth area.

In conventional OMVPE reactors, single ended gas injection schemes are typically used to distribute the gas flow across susceptors. Due to their inability to create a laminar gas flow across a wide cross-section distance, the resultant epilayer uniformity in the direction perpendicular to the gas flow direction is not as good as that in the direction parallel to the gas flow direction. Furthermore, the lack of uniformity also restricts the size of the wafers on which epilayers can be grown. In the evolution of processing equipment for device and integrated circuit fabrication, the ability of handling larger wafer sizes has continuously expanded to enable increased product output or throughput. OMPVE technology has become important in the fabrication of microwave and optoelectronic device applications.

A gas distribution arrangement is required for providing an extremely uniform gas flow across a wide distance perpendicular to the gas flow if epilayer uniformity in the direction perpendicular to the gas flow direction is to be as good as that in the direction parallel to gas flow direction. This characteristic is particularly important for scaling up of horizontal type OMVPE reactors and would also be useful for vertical type OMVPE reactors for improving their uniformity of the deposited epilayer.

SUMMARY OF THE INVENTION

It is therefore a primary object of the present invention to provide a gas distribution arrangement for improving uniformity of deposited epilayers in all types of OMVPE reactors.

A related object of the invention is to improve uniformity of deposited epilayers such that larger wafers can be accomodated in OMVPE reactors.

A further object of the invention is to provide an OMVPE reactor having such high uniformity deposition capability that uniform layers at the atomic level forming abrupt transistors can be grown on large wafers.

The invention takes the form of a gas distributor capable of producing a laminar gas flow in a growth chamber having a substantial area for the deposition of layers on wafers.

In an illustrative application of the invention in a reactor, the reactor is an OMVPE reactor having a confined volume growth chamber wherein the gas distributor provides a laminar gas flow. The laminar gas flow provides a growth rate for the deposited layer which in the direction perpendicular to the gas flow is equal to that in the direction parallel to the gas flow resulting in layers of high uniformity.

In some of the further aspects of the invention, the gas distributor has a conical shaped expansion chamber which also mixes the received gas supplied to a plurality of ports. A gas line extends from each port to an aperture located in a recess located in a wall inside the growth chamber. The gas lines corresponding to the number of ports and apertures are equal in length. The recess is adapted to receive a quartz insert/liner wherein wafers are located for deposition. The correspondence between ports and apertures is made random. The pattern of ports is located in a base portion of the conical expansion chamber and forms a radial pattern of equal angular displacement between ports at predetermined radius from a centrally located port in the base portion. When the wafer material is in place it is located on an RF heated susceptor in the quartz insert in a load-locked arrangement. The susceptors is made of graphite and coated with silicon carbide.

BRIEF DESCRIPTION OF THE DRAWING

Features of the invention and additional objects of the invention will be more readily appreciated and better understood by reference to the following detailed description which should be considered in conjunction with the drawing.

FIG. 4 is a perspective view of a susceptor and a low volume quartz liner wherein the deposition layers are grown in accordance with the inventive principles.

FIG. 5 demonstrates the performance of an arrangement in accordance with the invention in terms of thickness uniformity of grown OMVPE layers.

DETAILED DESCRIPTION

Figure 1:
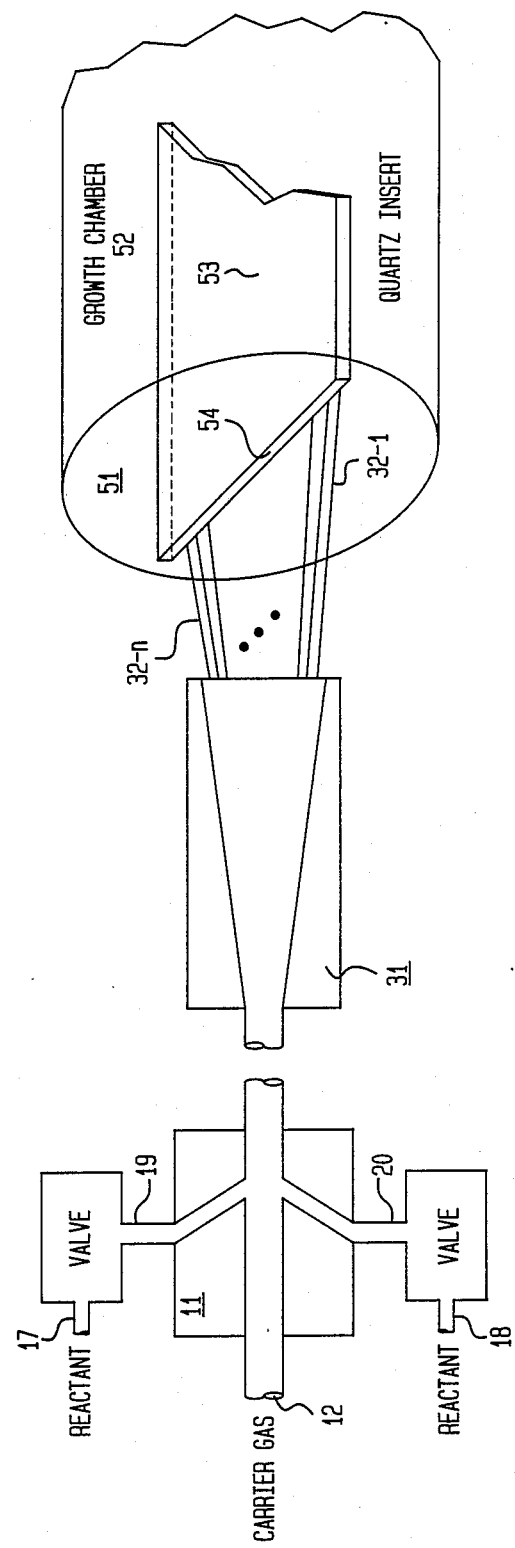
FIG. 1 is a schematic diagram of a gas injection arrangement in accordance with the principles of the present invention.

FIG. 1 provides a schematic diagram of the key components of an overall reactor wherein the inventive principles are deployed to advantage. At the input side of the reactor, a radial gas injection manifold 11 feeds gas distributor 31. The input 12 is provided with a measured flow of a carrier gas, typically hydrogen. Radially situated around the manifold 11 in a plane perpendicular to the drawing are a plurality of valve displaced in equal angular increments represented valves 13 and 14 although typically eight and up to twelve valves may be used. Such an arrangement ensures that the suitability of the reactor for multiple process gases and dopants for compound semiconductor materials such as quaternary and even more complex materials. A suitable reactant is individually applied to an input port for each value. For example, valves 13 and 14 have respective input ports 17 and 18 and run ports respectively connected to run lines 19 and 20. Each of valves 13 and 14 may take the form of a three-way or a four-way valve for flushing and/or venting purposes. The output of manifold 11 provides gas distributor 31 with the appropriate mixture for vapor phase deposition.

Gas distributor 31 provides uniform mixing of its input composition and provides equal flow rates to a plurality of individual tubes 32-1 to 32-n which are each connected to individual ports in plate 51 which forms one boundary of growth chamber 52. Typically, plate 51 is fitted to a flange 53 which is connected to a cylindrical glass so that the growth chamber takes the form of a horizontally mounted bell jar wherein a quartz insert 53 is horizontally oriented. The pressure in the growth chamber may range from atmospheric to low pressures of fifty to one hundred torr which is maintained by a suitable 30 cfm mechanical pump (not shown in FIG. 1). The purpose of gas distributor 31 is to produce a laminar gas flow inside insert 53. Typically, the wafers for growth layer deposition are placed on a susceptor (not shown in FIG. 1) which is heated by an RF induction source to a typical temperature in the range of six hundred to eight hundred degrees Celsius.

Figure 2:
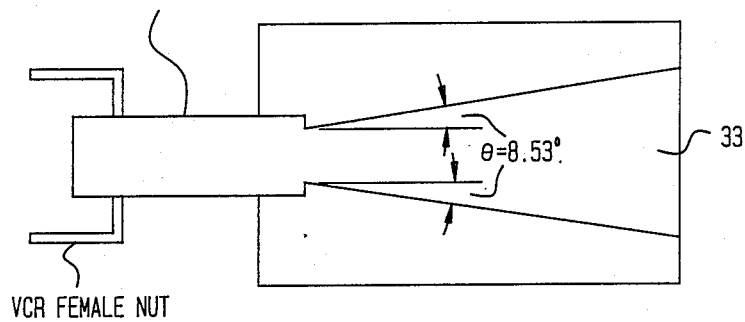
FIG. 2 is a cross-sectional view of the expansion and mixing chamber portion of the gas distribution deployed in FIG. 1.

FIG. 2 presents a cross-sectional view of distributor 31 through its central axis to provide a view of cavity 32 which fans outward on each side at angle $\phi$. The input to cavity 32 is adapted for connection to a commercially available connector (VCR Gland SS-4-VCR manufactured by Cajon. In this case, $\phi$ is selected to have an angle of 8.53° but any value is acceptable within a range of 5°–10° so long as the two angular values are equal. Although not readily apparent from FIG. 2, distributor 31 has a generally cylindrical shape from which a vertical cross section is taken so that cavity 32 has a generally conical shape. Distributor 31 and the components coupled to it for handling the gas are made of stainless steel such as 316 stainless steel.

Figure 3:
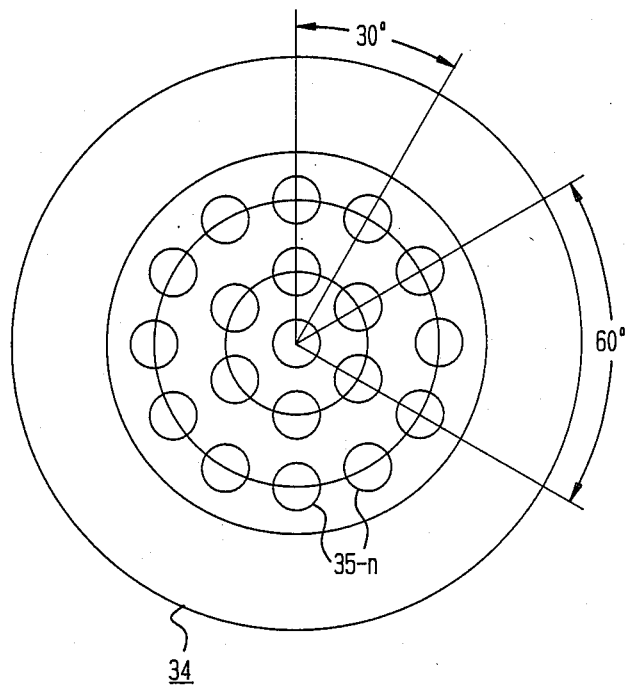
FIG. 3 provides a backside view of the multiple port distribution arrangement for the outlet portion of the distributor of FIG. 2.

FIG. 3 illustrates an end view of multiple port cap 34 which fits on to wall 33. Cap 34 includes a plurality of holes 35-n equally distributed over an opening in wall 33 at the outlet portion of distributor 31. A piece of tubing is inserted through each of holes 35-n to extend a short distance inside cavity 32, for example about $\frac{1}{8}$ which is welded at the joint between the inside portion of the hole and the outside of each of tubes 32-n. Each of tubes 32-1 through 32-n has the same length and extends in the same manner into plate 51. On the inside of plate 51 a rectangular recess 54 has an equal plurality of equally distributed holes therein. Each of tubes 32-n extends slightly into recess 54 and is welded in a manner similar to that in distributor cap 34. Uniform distribution of reactant gases is insured by the uniform length and random placement of tubes 32-n between distributor 31 and plate 51 of growth chamber 52. Recess 54 is adapted to receive insertion of quartz insert 53. It should now become apparent that distributor 31 functions both as a mixing manifold and a distributing injector.

FIG. 4 provides a detailed illustration of quartz liner 53 whose gas inlet 56 slides into rectangular recess 54 of plate 51. The internal cavity of insert 53 provides a chamber for the laminer flow of the gas mixture produced by manifold 11. The susceptor house 57 encloses a susceptor 55 which is a relatively thick rectangular slab of graphite material coated with silicon carbide. Susceptor 55 includes one or more circular recesses 60 for each wafer of semiconductor material to be coated which may be a single large wafer or multiple smaller wafers. With the susceptor in place the rear portion of quartz insert or liner 53 is closed off at inlet/outlet 57 to produce a gas flow over the top of the susceptor around its end portion into exhaust chamber 58 and exiting via exhaust line 59. A convenient arrangement for quartz liner 53 with susceptor 55 is provide a sled as a quartz carrier with an end plate that closes of the liner to form a load-locked growth chamber.

FIG. 5 provides a graphical illustration of uniformity for an epilayer deposition on a two inch wafer. In FIG. 5, the growth rate is illustrated over the wafer surface parallel to the gas flow and perpendicular to the gas flow under the growth conditions listed therein. Typical growth parameters chosen for the device structures were: fTMA = 1.38E-5, fTMG = 4.15 E-5, fAsH3 = 9.5E-3 for AlGaAs and 3.3 E-3 for GaAs, temperature - 700C for AlGaAs and 650° C. for GaAs with the pressure generally being 50 torr. As can be observed the growth rate is highly uniform for the most part and only deviates at the extreme positional valves.

In operation, good uniformity of material parallel to the gas flow direction and atomic-layer abrupt interface were achieved by utilizing a small volume, laminar-flow reactor operating at low pressure with gas transit velocity in excess of 300 cm/sec. Reproducibility was insured by the use of a load-locked growth chamber which has been in use in the MBE technology for years with good demonstrated reproducibility in the growth of Al based compounds. Reduced background impurities and defect density were obtained by developing an effective in-situ etching process which removes excess deposits from the susceptor surface and the reactor walls. In addition, the material properties grown by a reactor in accordance with the inventive principles demonstrated uniformities of thickness and Al composition, heterointerface abruptness and uniformities of sheet carrier concentration and electron mobility suitable for the high electron mobility transistor (HEMT) device structures.

The RF heated horizontal type reactor chamber coupled with a load-locked sample exchanging chamber was used to improve the material quality and reproducibility, especially for AlGaAs due to its quality being strongly sensitive to moisture and oxygen. The small volume integrated quartz insert, as shown in FIG. 3, including a quartz liner, a susceptor house and an exhaust chamber was used to increase the gas flow velocity so as to reduce the gas transient time. The specific scheme is also suitable for transferring the susceptor between the reaction chamber and the sample exchanging chamber. The quartz liner with a cross-section area of 18 cmz was used to introduce the laminar gas flow across the susceptor. The large area (13 cm X 20 cm) SiC coated graphite susceptor was precision machined to fit accurately to the quartz liner, without blocking the gas flow to retain laminar flow operation. The ceiling of the susceptor house was inclined 2 degrees with respect to the susceptor. A special chamber beneath the susceptor house was used to circulate the exhaust gases from downstream of the susceptor to the exhaust line in the same side of the reactant gas inlet. The quartz sled was used to transfer the susceptor between the reaction chamber and sample exchanging chamber as well as to seal the backside of the quartz insert. The volume between the outer quartz tube and the quartz insert was continuously purged with H2. Therefore, the reactant gases were confined within the quartz insert to reduce the dust condensation in the outer quartz tube and the gate valve.

Although the gas distributor arrangement herein is illustrated in context of a horizontal type OMVPE reactor, it is clear that such a gas distributor arrangement may be used in the described form or modified to obtain similar operational advantages in other types of reactors. For example, reactors equipped with a rotation scheme such as a vertical barrel type reactor. Also, the so-called barrel type reactor may be used for an application of the present inventive principles.

There has thus been shown and described a novel OMVPE reactor having a new gas distributor arrangement which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. Organometallic vapor phase epitaxy (OMVPE) apparatus for growing epitaxial layers on semiconductor wafers, the apparatus comprising:
   a radial gas injection manifold having a plurality of ports for receiving reactant gas and a port for receiving a carrier gas and producing a gas output;
   a growth chamber having a confined volume for receiving at least one semiconductor wafer, the growth chamber having a recess for receiving a quartz insert to provide the confined volume, the recess having a plurality of aperatures equally distributed in a bottom portion of the recess; and
   gas distributing means located between the manifold and the growth chamber comprising an expansion chamber connected to receive the gas output at one end and having a plurality of equally distributed ports at another end of the expansion chamber and a plurality of tubes wherein each tube extends from each of the ports to one of the plurality of aperatures, and the plurality of tubes have the same length for producing a laminar gas flow inside the quartz insert of the growth chamber.

2. Apparatus according to claim 1, wherein the correspondence between the tubes connected between the plurality of apertures in the gas distributing means and plurality ports in the recess of the growth chamber is random.

3. Apparatus according to claim 1, wherein the expansion chamber of the gas distributing means has a conical shape including a tip portion and a base portion and the other end with a plurality of distributed ports corresponds to the base portion of the conical shape.

4. Apparatus according to claim 3, wherein the plurality of equally distributed ports form a radial pattern having a central port and at least a first portion of ports distributed radially around the central port at a first radius in uniform angular increments and at least a second portion of ports distributed radially around the central port in uniform angular increments at a second radius larger than said first radius.

5. Apparatus according to claim 4, wherein the gas distributing means and the plurality of tubes comprise stainless steel.

6. Apparatus according to claim 5, wherein the quartz insert is adapted to receive a susceptor for carrying the at least one semiconductor wafer, the susceptor being subject to an RF field for elevating its temperature, and the quartz insert and susceptor forming a load locked chamber during operational positioning.

7. Apparatus according to claim 6, wherein the susceptor comprises graphite material having an outer coating of silicon carbide.

* * * * *